United States Patent
Hu et al.

(10) Patent No.: US 10,782,785 B2
(45) Date of Patent: Sep. 22, 2020

(54) VIBRO-HAPTIC DESIGN AND AUTOMATIC EVALUATION OF HAPTIC STIMULI

(71) Applicant: Cirrus Logic International Semiconductor Ltd., Edinburgh (GB)

(72) Inventors: Rong Hu, Austin, TX (US); Jie Su, Shanghai (CN); Harsha Rao, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 105 days.

(21) Appl. No.: 16/257,340

(22) Filed: Jan. 25, 2019

(65) Prior Publication Data

US 2019/0235629 A1 Aug. 1, 2019

Related U.S. Application Data

(60) Provisional application No. 62/623,156, filed on Jan. 29, 2018.

(51) Int. Cl.
*G06F 3/01* (2006.01)
*H01L 41/09* (2006.01)

(52) U.S. Cl.
CPC .............. *G06F 3/016* (2013.01); *H01L 41/09* (2013.01); *G06F 2203/014* (2013.01)

(58) Field of Classification Search
CPC ... G06F 3/016; G06F 2203/014; H01L 41/09; H04R 29/00; H04R 29/001; G08B 6/00
USPC .................... 340/407.1; 381/58, 59; 345/173
See application file for complete search history.

(56) References Cited

U.S. PATENT DOCUMENTS

| 8,380,561 B1* | 2/2013 | Viegas ............... G06Q 30/0201 119/174 |
| 2017/0178470 A1* | 6/2017 | Khoshkava ........... G06F 3/0414 |
| 2019/0235628 A1* | 8/2019 | Lacroix ................... G06F 3/016 |

OTHER PUBLICATIONS

Pongrac, Helena, "Vibrotactile perception: differential effects of frequency, amplitude, and acceleration," 2006 IEEE International Workshop on Haptic Audio Visual Environments and their Applications, Nov. 4-5, 2006.

Johnson, K., "Neural Basis of Haptic Perception", in S. Yantis & H. Pasher (Eds), Stevens' handbook of experimental psychology, vol. 1: Sensation and perception, New York, John Wiley, 2002, pp. 537-583.

Inwook Hwang, Jongman Seo, Myongchan Kim, and Seungmoon Choi, "Perceived Intensity of Tool-Transmitted Vibration: Effect of Amplitude and Frequency", 2016 IEEE International Workshop on Haptic Audio Visual Environments and Games.

* cited by examiner

*Primary Examiner* — Jason R Kurr
(74) *Attorney, Agent, or Firm* — Jackson Walker L.L.P.

(57) ABSTRACT

A method for quantifying fidelity of a haptic signal may include receiving a response signal indicative of a vibrational response of a vibrational transducer to a haptic playback waveform driven to the vibrational transducer, perceptually filtering the response signal to obtain human haptic-perceptible components of the response signal, and quantifying fidelity of the haptic playback waveform based on at least one quantitative characteristic of the human haptic-perceptible components of the response signal.

28 Claims, 7 Drawing Sheets

VIBRO-HAPTIC DESIGN AND AUTOMATIC EVALUATION OF HAPTIC STIMULI

RELATED APPLICATION

The present disclosure claims priority to U.S. Provisional Patent Application Ser. No. 62/623,156, filed Jan. 29, 2018, which is incorporated by reference herein in its entirety.

FIELD OF DISCLOSURE

The present disclosure relates in general to electronic devices with user interfaces, (e.g., mobile devices, game controllers, instrument panels, etc.), and more particularly, a haptic system for use in a system for mechanical button replacement in a mobile device, for use in haptic feedback for capacitive sensors, and/or other suitable applications.

BACKGROUND

Linear resonant actuators (LRAs) and other vibrational actuators (e.g., rotational actuators, vibrating motors, etc.) are increasingly being used in mobile devices (e.g., mobile phones, personal digital assistants, video game controllers, etc.) to generate vibrational feedback for user interaction with such devices. Typically, a force/pressure sensor detects user interaction with the device (e.g., a finger press on a virtual button of the device) and in response thereto, the linear resonant actuator vibrates to provide feedback to the user. For example, a linear resonant actuator may vibrate in response to force to mimic to the user the feel of a mechanical button click.

With appropriate design of input signal to an LRA, certain forms of vibration patterns may be generated, and specific haptic effects may be perceived by a user. Among such haptic application scenarios, one important type of haptic notification is generation of a button click (or virtual switch) effect, in which natural, sharp, and clear-cut haptic perceptions generated by the LRA that mimic the clicks of a true mechanical button are desirable.

From a haptic waveform received at its input, an LRA transducer may create a main pulse of vibrations on a device, followed by a tail of residual resonant vibrations of certain length, depending on characteristics of input haptic waveform stimulus together with the vibrational properties of the LRA. To achieve sharp and clear-cut haptic perceptions on a user's fingers and/or palm, it is important to appropriately design the waveform stimulus input to the LRA, so that the vibration pulses felt by the user satisfy certain time and frequency patterns (e.g., within a certain time duration range) and do not have prolonged resonating tails. A feedback vibration pattern with either too long a main pulse or with excessive duration in resonating tails may deteriorate the sharpness and clarity (or "crispness") of the haptic feeling on the fingertip and/or palm, and may render the perception to have prolonged ringing, which is far less pleasant compared to the natural and crisp perceptions typically generated by a well-designed conventional mechanical button.

Accordingly, measures for evaluation of perceived haptic effects are desired. Subjective evaluations, e.g., manual haptic scoring by human subjects on device under test (DUT), is one potential method. Subjective scoring has the advantage in that it directly describes human perception. However, subjective evaluations also demonstrate disadvantages, such as being more expensive in cost and involving higher time consumption, less efficiency, and potential variations due to differing human subjectivity and perception.

Several objective evaluation measures already exist for the characterization of haptic performances based on the analysis of measurement of a vibrational signal waveform. Some examples of objective measures, which provide different perspectives in the objective description of vibro-haptic performance of virtual mechanical button clicks generated by an LRA upon a given stimulus signal, may include:

1) Peak or root-mean-square (RMS) vibration level (e.g., stated in units of acceleration), in the form of maximum acceleration peak value, may describe the maximum intensity, or strength, of a vibration generated by an LRA. Such measure may provide a coarse estimate of strength of the energy of a haptic response. An actual human perception of the strength may deviate from this value, depending on the actual characteristics of the vibrational pulse.

2) Attack time (e.g., stated in milliseconds) may describe a latency from a start of a response stimulus to the time when the vibration level reaches 90% of the above mentioned peak level. Such measure may quantify how fast a haptic click happens and achieves its maximum strength.

3) Decay time (e.g., stated in milliseconds) may describe a latency from the time of peak vibration to the time when the vibration level drops below 10% of the peak vibration level. It tells how fast the haptic vibration decays in energy, but not necessarily in haptic-perceivable energy.

These objective measures are computationally simple and robust, and have already found applications in LRA component and system evaluations and specifications. However, they fail to provide a subjectively reliable measure that is relevant to subjective human haptic perceptions, and thus objective measures to reliably measure subjective perceptions are desired.

SUMMARY

In accordance with the teachings of the present disclosure, the disadvantages and problems associated with generating haptic feedback in a mobile device may be reduced or eliminated.

In accordance with embodiments of the present disclosure, a method for quantifying fidelity of a haptic signal may include receiving a response signal indicative of a vibrational response of a vibrational transducer to a haptic playback waveform driven to the vibrational transducer, perceptually filtering the response signal to obtain human haptic-perceptible components of the response signal, and quantifying fidelity of the haptic playback waveform based on at least one quantitative characteristic of the human haptic-perceptible components of the response signal.

In accordance with embodiments of the present disclosure, a system for quantifying fidelity of a haptic signal may include an input configured to receive a response signal indicative of a vibrational response of a vibrational transducer to a haptic playback waveform driven to the vibrational transducer and a processor configured to perceptually filter the response signal to obtain human haptic-perceptible components of the response signal and quantify fidelity of the haptic playback waveform based on at least one quantitative characteristic of the human haptic-perceptible components of the response signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
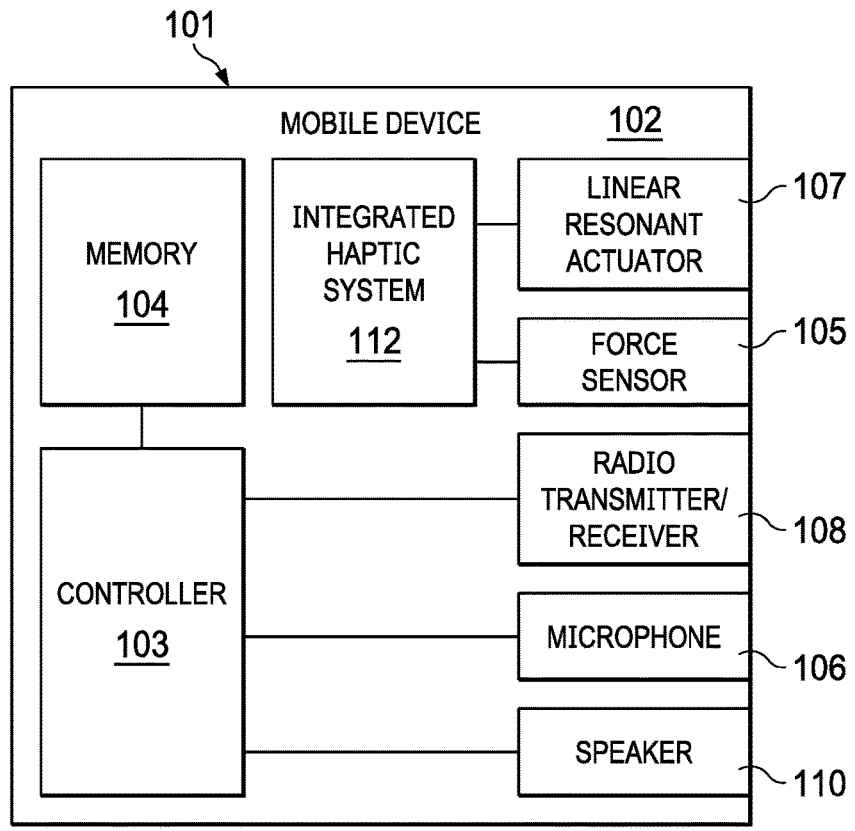
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a force sensor 105, a microphone 106, a linear resonant actuator 107, a radio transmitter/receiver 108, a speaker 110, and an integrated haptic system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 interprets and/or executes program instructions and/or processes data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies as based on sonic vibrations received at the diaphragm or membrane. Microphone 106 may include an electrostatic microphone, a condenser microphone, an electret microphone, a microelectromechanical systems (MEMs) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The coil and the driver's magnetic system interact, generating a mechanical force that causes the coil (and thus, the attached cone) to move back and forth, thereby reproducing sound under the control of the applied electrical signal coming from the amplifier.

Force sensor 105 may be housed within enclosure 101, and may include any suitable system, device, or apparatus for sensing a force, a pressure, or a touch (e.g., an interaction with a human finger) and generating an electrical or electronic signal in response to such force, pressure, or touch. In some embodiments, such electrical or electronic signal may be a function of a magnitude of the force, pressure, or touch applied to the force sensor. In these and other embodiments, such electronic or electrical signal may comprise a general purpose input/output signal (GPIO) associated with an input signal to which haptic feedback is given (e.g., a capacitive touch screen sensor or other capacitive sensor to which haptic feedback is provided). For purposes of clarity and exposition in this disclosure, the term "force" as used herein may refer not only to force, but to physical quantities indicative of force or analogous to force, such as, but not limited to, pressure and touch.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from integrated haptic system 112, may render haptic feedback to a user of mobile device 102 for at least one of mechanical button replacement and capacitive sensor feedback.

Integrated haptic system 112 may be housed within enclosure 101, may be communicatively coupled to force sensor 105 and linear resonant actuator 107, and may include any system, device, or apparatus configured to receive a signal from force sensor 105 indicative of a force applied to mobile device 102 (e.g., a force applied by a human finger to a virtual button of mobile device 102) and generate an electronic signal for driving linear resonant actuator 107 in response to the force applied to mobile device 102. Detail of an example integrated haptic system in accordance with embodiments of the present disclosure is depicted in FIG. 2.

Although specific example components are depicted above in FIG. 1 as being integral to mobile device 102 (e.g., controller 103, memory 104, force sensor 105, microphone 106, radio transmitter/receiver 108, speakers(s) 110), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components.

Figure 2:
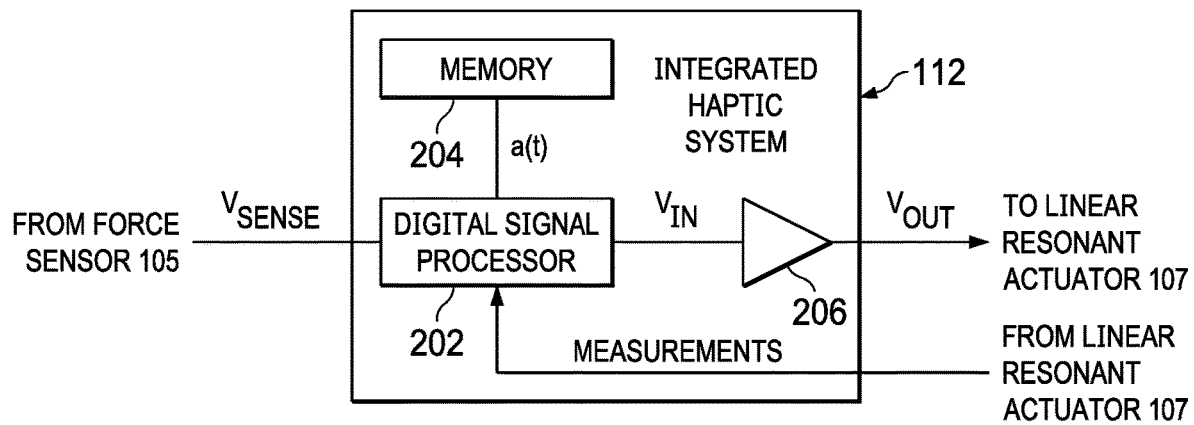
FIG. 2 illustrates a block diagram of selected components of an example integrated haptic system, in accordance with embodiments of the present disclosure.

FIG. 2 illustrates a block diagram of selected components of an example integrated haptic system 112, in accordance with embodiments of the present disclosure. In some embodiments, integrated haptic system 112 may be used to implement integrated haptic system 112 of FIG. 1. Although FIG. 2 depicts an example of an integrated haptic system, other implementations for a haptic system may be used, including without limitation those implementations described in U.S. patent application Ser. No. 15/722,128 entitled "Integrated Haptic System," and filed Oct. 2, 2017, which is incorporated by reference herein in its entirety.

As shown in FIG. 2, integrated haptic system 112 may include a digital signal processor (DSP) 202, a memory 204, and an amplifier 206. DSP 202 may include any system, device, or apparatus configured to interpret and/or execute program instructions and/or process data. In some embodiments, DSP 202 may interpret and/or execute program instructions and/or process data stored in memory 204 and/or other computer-readable media accessible to DSP 202.

Memory 204 may be communicatively coupled to DSP 202, and may include any system, device, or apparatus configured to retain program instructions and/or data for a period of time (e.g., computer-readable media). Memory 204 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Amplifier 206 may be electrically coupled to DSP 202 and may comprise any suitable electronic system, device, or apparatus configured to increase the power of an input signal $V_{IN}$ (e.g., a time-varying voltage or current) to generate an output signal $V_{OUT}$. For example, amplifier 206 may use electric power from a power supply (not explicitly shown) to increase the amplitude of a signal. Amplifier 206 may include any suitable amplifier class, including without limitation, a Class-D amplifier.

In operation, memory 204 may store one or more haptic playback waveforms. In some embodiments, each of the one or more haptic playback waveforms may define a haptic response a(t) as a desired acceleration of a linear resonant actuator (e.g., linear resonant actuator 107) as a function of time. DSP 202 may be configured to receive a force signal $V_{SENSE}$ from force sensor 105 indicative of force applied to force sensor 105. Either in response to receipt of force signal $V_{SENSE}$ indicating a sensed force or independently of such receipt, DSP 202 may retrieve a haptic playback waveform from memory 204 and process such haptic playback waveform to determine a processed haptic playback signal $V_{IN}$. In embodiments in which amplifier 206 is a Class D amplifier, processed haptic playback signal $V_{IN}$ may comprise a pulse-width modulated signal. In response to receipt of force signal $V_{SENSE}$ indicating a sensed force, DSP 202 may cause processed haptic playback signal $V_{IN}$ to be output to amplifier 206, and amplifier 206 may amplify processed haptic playback signal $V_{IN}$ to generate a haptic output signal $V_{OUT}$ for driving linear resonant actuator 107. Detail of an example processing system implemented by DSP 202 is depicted in FIG. 3.

In some embodiments, integrated haptic system 112 may be formed on a single integrated circuit, thus enabling lower latency than existing approaches to haptic feedback control. By providing integrated haptic system 112 as part of a single monolithic integrated circuit, latencies between various interfaces and system components of integrated haptic system 112 may be reduced or eliminated.

Figure 3:
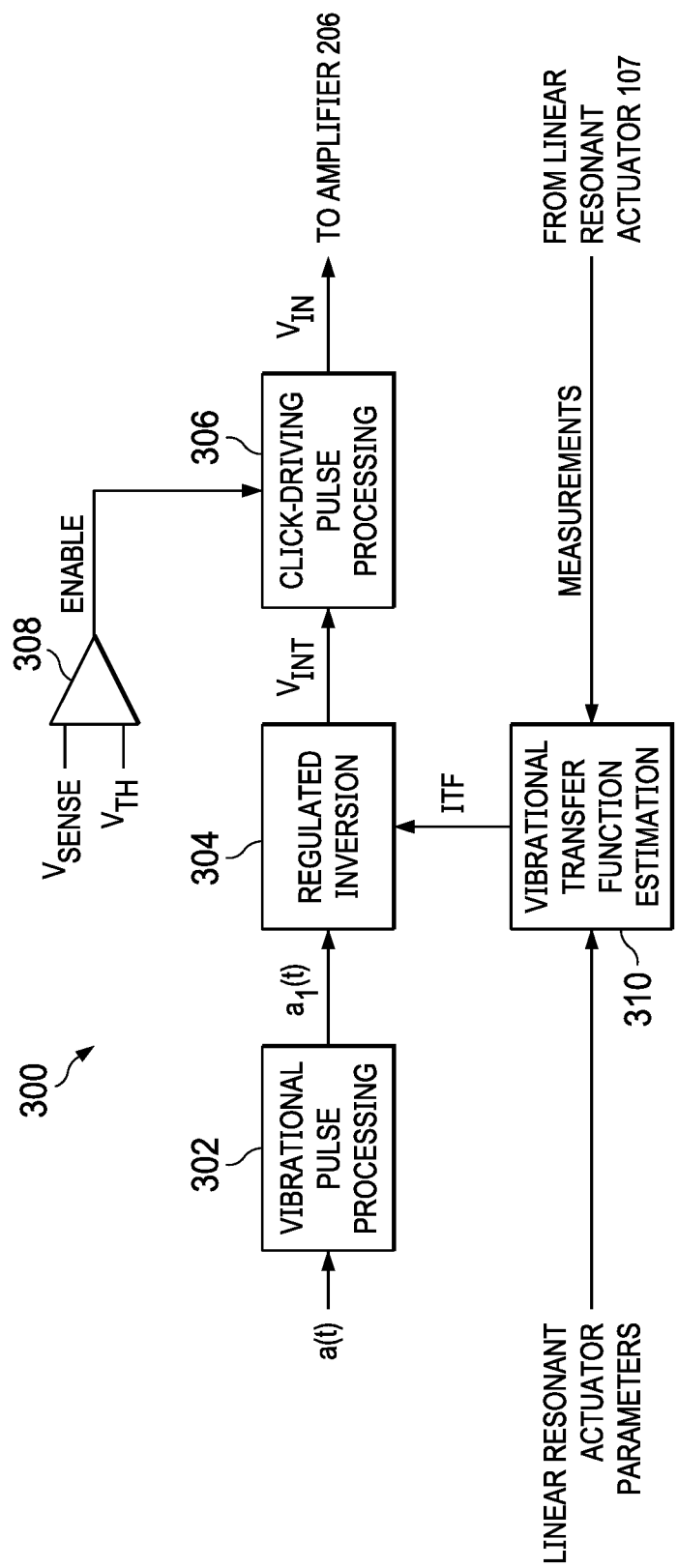
FIG. 3 illustrates a block diagram of selected components of an example processing system for use in the integrated haptic system of FIG. 2, in accordance with embodiments of the present disclosure.

As shown in FIG. 3, DSP 202 may receive diagnostic inputs from which processing system 300 may monitor and adjust operation of amplifier 206 in response thereto. For example, as discussed below with respect to FIG. 3, DSP 202 may receive measurements from linear resonant actuator 107 to estimate the vibrational transfer function of linear resonant actuator 107. However, in some embodiments, DSP 202 may receive and monitor one or more other diagnostic inputs, and DSP 202 may control operation of amplifier 206 in response thereto. For example, in some embodiments, DSP 202 may monitor a current level associated with linear resonant actuator 107 and/or a voltage level associated with linear resonant actuator 107. From such measurements, DSP 202 may be able to infer or calculate a status (e.g., status of motion) of linear resonant actuator 107. For example, from a monitored voltage and current, DSP 202 may be able to employ a mathematical model of linear resonant actuator 107 to estimate a displacement, velocity, and/or acceleration of linear resonant actuator 107. As another example, DSP 202 may inject a high-frequency signal into linear resonant actuator 107 and infer an inductance of linear resonant actuator 107 based on the current and/or voltage responses of linear resonant actuator 107 to the injected signal. From the inductance, DSP 202 may be able to estimate a displacement of linear resonant actuator 107. Based on determined status information (e.g., displacement, velocity, and/or acceleration), DSP 202 may control processed haptic playback signal $V_{IN}$ for any suitable purpose, including protecting linear resonant actuator 107 from over-excursion that could lead to damage to linear resonant actuator 107 or other components of mobile device 102. As yet another example, one or more diagnostic inputs may be monitored to determine an operational drift of linear resonant actuator 107, and DSP 202 may control amplifier 206 and/or processed haptic playback signal $V_{IN}$ in order to account for the operational drift. As a further example, one or more diagnostic inputs may be monitored to determine temperature effects of linear resonant actuator 107 (e.g., thermally induced changes in the performance of linear resonant actuator 107), and DSP 202 may control amplifier 206 and/or processed haptic playback signal $V_{IN}$ in order to account for the temperature effects.

FIG. 3 illustrates a block diagram of selected components of an example processing system 300 implemented by DSP 202, in accordance with embodiments of the present disclosure. As shown in FIG. 3, processing system 300 may include vibrational pulse processing 302, regulated inversion 304, click-driving pulse processing 306, a comparator 308, and vibrational transfer function estimation 310. In operation, vibrational pulse processing 302 may receive a haptic playback waveform a(t) (or relevant parameters of such a waveform such as frequency and duration) and process such waveform to generate an intermediate signal $a_1(t)$. Processing performed by vibrational pulse processing 302 may include, without limitation, filtering (e.g., band-pass filtering) for frequency bands of interest, equalization of haptic playback waveform a(t) to obtain a desired spectral shape, and/or temporal truncation or extrapolation of haptic playback waveform a(t). By adjusting or tuning the temporal duration and frequency envelope of haptic playback waveform a(t), various haptic feelings as perceived by a user and/or audibility of the haptic response may be achieved.

Regulated inversion 304 may apply an inverse transfer function ITF to intermediate signal $a_1(t)$, either in the frequency domain or equivalently in the time domain through inverse filtering. Such inverse transfer function ITF may be generated from vibrational transfer function estimation 310 based on actual vibrational measurements of linear resonant actuator 107 and/or model parameters of linear resonant actuator 107. Inverse transfer function ITF may be the inverse of a transfer function that correlates output voltage signal $V_{OUT}$ to actual acceleration of linear resonant actuator 107. By applying inverse transfer function ITF to intermediate signal $a_1(t)$, regulated inversion 304 may generate an inverted vibration signal $V_{INT}$ in order to apply inversion to specific target vibrational click pulses to obtain an approximation of certain desired haptic click signals to drive the vibrational actuators for the generation of haptic clicks. In embodiments in which inverse transfer function ITF is calculated based on measurements of linear resonant actuator 107, processing system 300 may implement a closed-loop feedback system for generating output signal $V_{OUT}$, such that processing system 300 may track vibrational characteristics of linear resonant actuator 107 over the lifetime of linear resonant actuator 107 to enable more accurate control of the haptic response generated by integrated haptic system 112.

In some embodiments, processing system 300 may not employ an adaptive inverse transfer function ITF, and instead apply a fixed inverse transfer function ITF. In yet other embodiments, the haptic playback waveforms a(t) stored in memory 204 may include waveforms already adjusted by a fixed inverse transfer function ITF, in which case processing system 300 may not include blocks 302 and 304, and haptic playback waveforms a(t) may be fed directly to click-driving pulse processing block 306.

Click-driving pulse processing 306 may receive inverted vibration signal $V_{INT}$ and control resonant tail suppression of inverted vibration signal $V_{INT}$ in order to generate processed haptic playback signal $V_{IN}$. Processing performed by click-driving pulse processing 306 may include, without limitation, truncation of inverted vibration signal $V_{INT}$, minimum phase component extraction for inverted vibration signal $V_{INT}$, and/or filtering to control audibility of haptic playback signal $V_{IN}$.

Comparator 308 may compare a digitized version of force signal $V_{SENSE}$ to a signal threshold $V_{TH}$ related to a threshold force, and responsive to force signal $V_{SENSE}$ exceeding signal threshold $V_{TH}$, may enable haptic playback signal $V_{IN}$ to be communicated to amplifier 206, such that amplifier 206 may amplify haptic playback signal $V_{IN}$ to generate output signal $V_{OUT}$.

Although FIG. 3 depicts comparator 308 as a simple analog comparator, in some embodiments, comparator 308 may include more detailed logic and/or comparison than shown in FIG. 3, with the enable signal ENABLE output by comparator 308 depending on one or more factors, parameters, and/or measurements in addition to in or lieu of comparison to a threshold force level.

In addition, although FIG. 3 depicts enable signal ENABLE being communicated to click-driving pulse processing 306 and selectively enabling/disabling haptic playback signal $V_{IN}$, in other embodiments, enable signal ENABLE may be communicated to another component of processing system 300 (e.g., vibrational pulse processing 302) in order to enable, disable, or otherwise condition an output of such other component.

Figure 4:
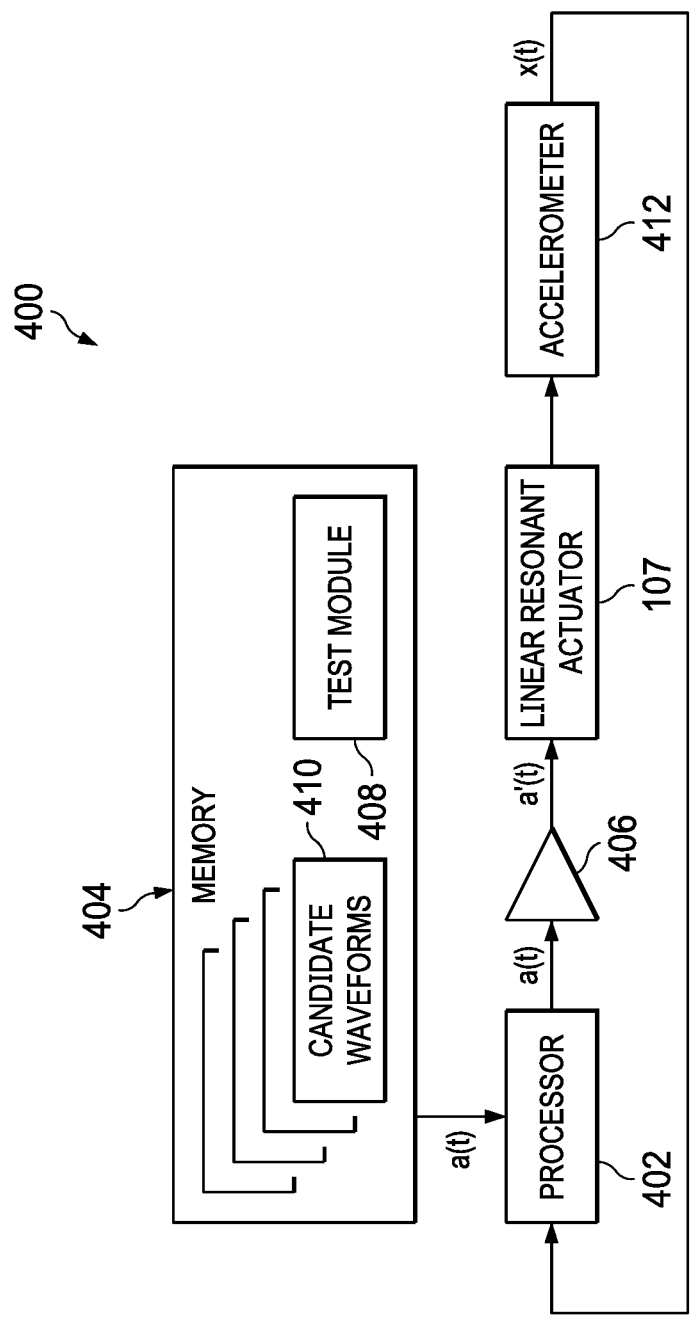
FIG. 4 illustrates a block diagram of selected components of an example test system for evaluation of haptic stimuli for use in design of haptic waveforms and haptic devices, in accordance with embodiments of the present disclosure.

As noted above with regard to the description of FIG. 2, integrated haptic system 112 may include memory 204 for storing input haptic waveforms for input to linear resonant actuator 107 (e.g., after processing by DSP 202 and amplification by amplifier 206). However, as noted in the Background section of this application, determination of the one or more specific haptic waveforms to store in memory 204 may be critical to generation of a pleasing or otherwise desirable haptic response by linear resonant actuator 107. To that end, FIG. 4 illustrates a block diagram of selected components of an example test system 400 for evaluation of haptic stimuli for use in design of haptic waveforms and haptic devices, in accordance with embodiments of the present disclosure. As shown in FIG. 4, example test system 400 may include a processor 402, a memory 404, an amplifier 406, a linear resonant actuator 107 as a device under test, and an accelerometer 412.

Processor 402 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 402 may interpret and/or execute program instructions and/or process data stored in memory 404 and/or other computer-readable media accessible to processor 402, as described in greater detail below.

Memory 404 may be communicatively coupled to processor 402, and may include any system, device, or apparatus configured to retain program instructions and/or data for a period of time (e.g., computer-readable media). Memory 404 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to test system 400 is turned off. As shown in FIG. 4, memory 404 may include test module 408 and candidate waveforms 410.

Test module 408 may comprise a program of executable instructions that may be read and executed by processor 402 to carry out some or all of the functionality of test system 400, as described in greater detail below.

Candidate waveforms 410 may comprise one or more haptic playback waveforms. In some embodiments, each of the one or more haptic playback waveforms may define a haptic response a(t) as a desired acceleration of a linear resonant actuator (e.g., linear resonant actuator 107) as a function of time. In operation, as described in greater detail below, test module 408 executing on processor 402 may evaluate the one or more candidate waveforms 410 to provide an objective measure of user-perceived haptic sensation by applying a candidate waveform 410 to the input of linear resonant actuator 107 and analyzing an acceleration response signal x(t) generated by accelerometer 412.

Amplifier 406 may be electrically coupled to processor 402 and may comprise any suitable electronic system, device, or apparatus configured to increase the power of an input signal (e.g., a(t), represented as a time-varying voltage or current) to generate an output signal (e.g., a'(t), represented as a time-varying voltage or current). For example, amplifier 406 may use electric power from a power supply (not explicitly shown) to increase the amplitude of a signal. Amplifier 406 may include any suitable amplifier class, including without limitation, a Class-D amplifier. In some embodiments, amplifier 406 may be identical or substantially similar to amplifier 206 of integrated haptic system 112.

Accelerometer 412 may be communicatively coupled to processor 402, and may include any system, device, or apparatus configured to measure an acceleration (e.g., proper acceleration) generated by linear resonant actuator 107 and generate an acceleration response signal x(t) indicative of such measured acceleration.

Figure 5:
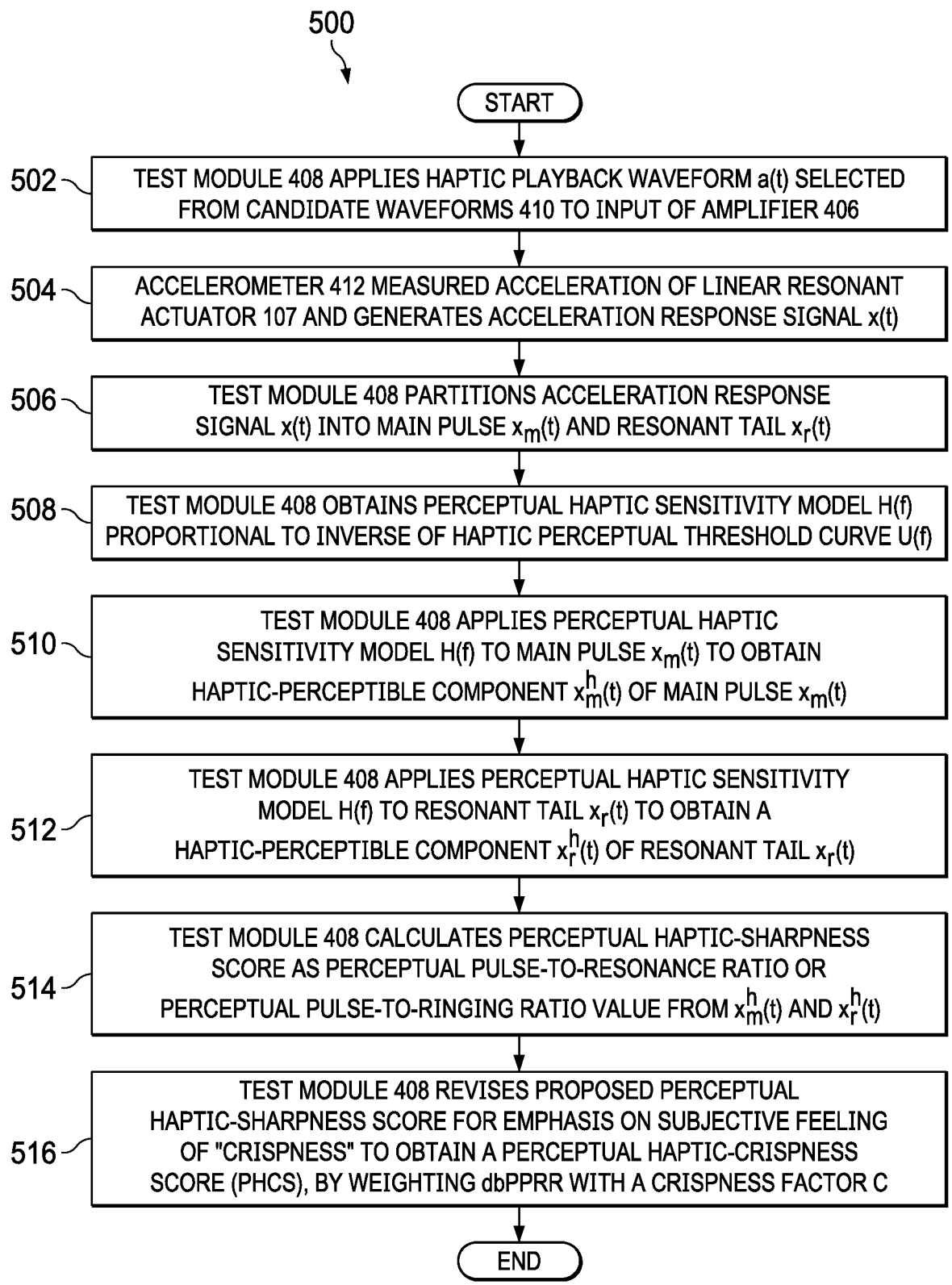
FIG. 5 illustrates a flow chart of an example method for determination of a perceived-haptic sharpness measure, in accordance with embodiments of the present disclosure.

FIG. 5 illustrates a flow chart of an example method 500 for determination of a perceived haptic sharpness measure that may take into account the properties of human vibrohaptic (or vibro-tactile) perception, in accordance with embodiments of the present disclosure. According to some embodiments, method 500 may begin at step 502. As noted above, teachings of the present disclosure may be implemented in a variety of configurations of test system 400. As such, the preferred initialization point for method 500 and the order of the steps comprising method 500 may depend on the implementation chosen.

Figure 6A:
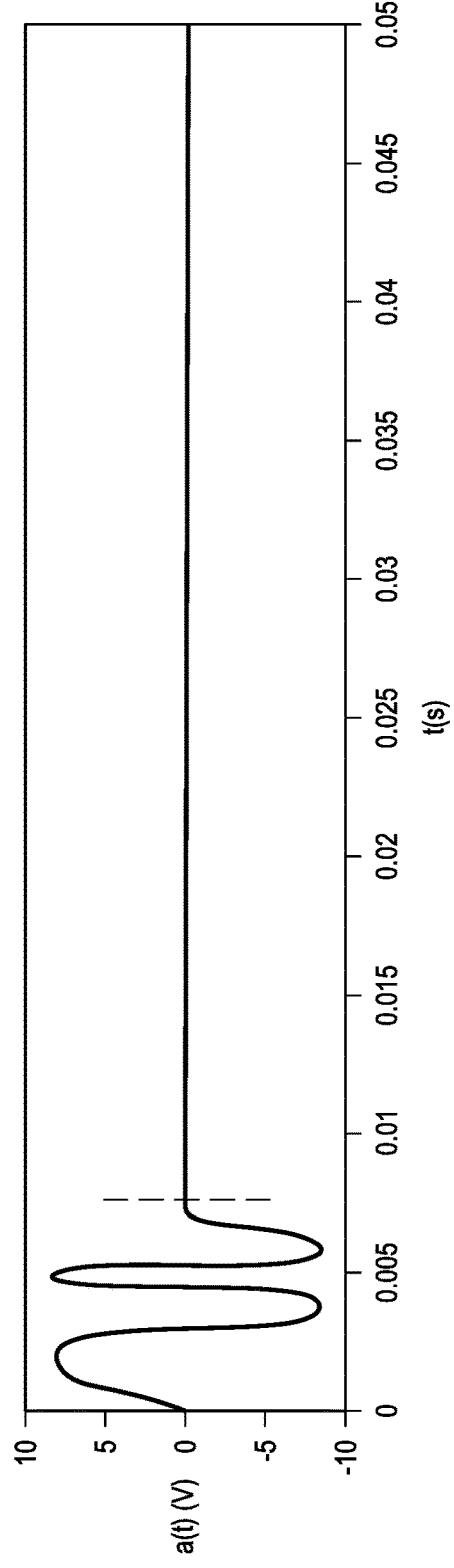
FIG. 6A illustrates an example haptic playback waveform a(t), in accordance with embodiments of the present disclosure.

At step 502, test module 408 executing on processor 402 may apply a haptic playback waveform a(t) selected from candidate waveforms 410 to the input of amplifier 406, which in turn may amplify haptic playback waveform a(t) to generate an amplified haptic playback waveform a'(t) (e.g., a voltage signal) at the input of linear resonant actuator 107. FIG. 6A illustrates an example haptic playback waveform a(t), in accordance with embodiments of the present disclosure.

Figure 6B:
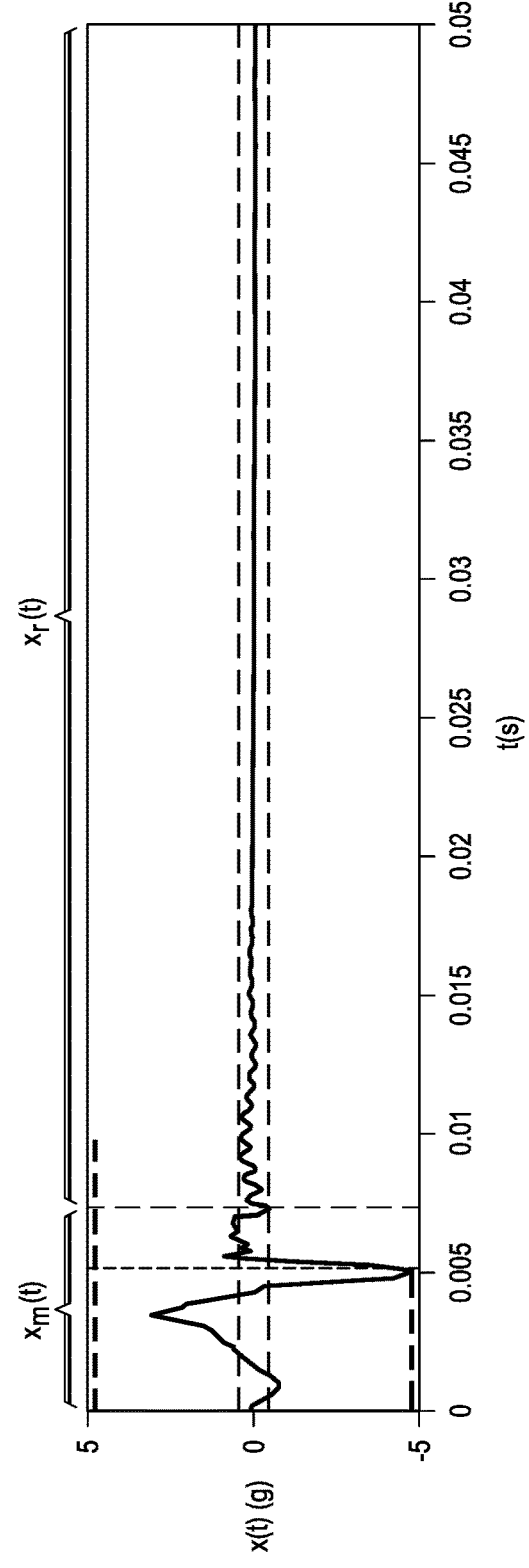
FIG. 6B illustrates an example acceleration response signal measured in response to the example haptic playback waveform shown in FIG. 6A, in accordance with embodiments of the present disclosure.

In response, at step 504, linear resonant actuator 107 may vibrate as a function of amplified haptic playback waveform a'(t), and acceleration generated by linear resonant actuator 107 may be measured by accelerometer 412, which may generate an acceleration response signal x(t) indicative of such measured acceleration. FIG. 6B illustrates an example acceleration response signal x(t) measured in response to the example haptic playback waveform a(t) shown in FIG. 6A, in accordance with embodiments of the present disclosure. In FIG. 6B, example acceleration response signal x(t) is depicted in units of acceleration (e.g., in terms of the net acceleration that is imparted to objects due to the combined effect of gravitation from distribution of mass within Earth and the centrifugal force from the Earth's rotation, which is denoted as "g").

At step 506, processor 402 may receive acceleration response signal x(t) and test module 408 may read acceleration response signal x(t) and partition it into two parts: a main pulse $x_m(t)$ and a resonant tail $x_r(t)$, as shown in FIG. 6B. For example, main pulse $x_m(t)$ may represent the portion of acceleration response signal x(t) from time zero until acceleration response signal x(t) has decayed to a certain percentage (e.g., 10 percent) of its peak value, while resonant tail $x_r(t)$ may represent the remainder of acceleration response signal x(t).

Figure 7:
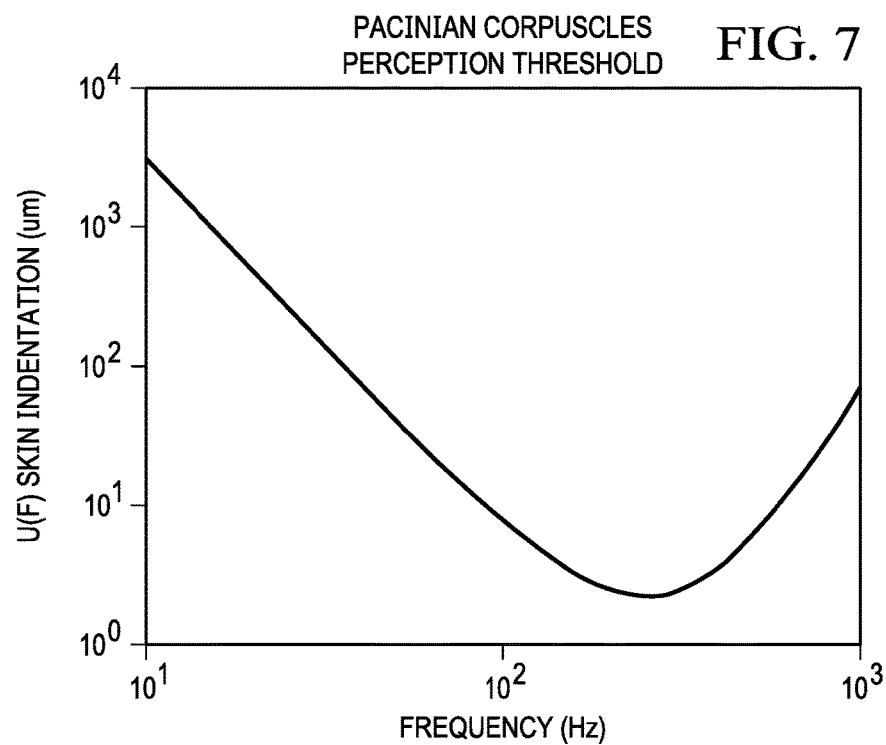
FIG. 7 illustrates an example of a haptic perceptual threshold curve, in accordance with embodiments of the present disclosure.

At step 508, test module 408 may obtain a perceptual haptic sensitivity model H(f) that is proportional to the inverse of a haptic perceptual threshold curve U(f) (e.g., $H(f) \propto 1/U(f)$). FIG. 7 depicts an example of a haptic perceptual threshold curve U(f), in accordance with embodiments of the present disclosure. In research performed in the scientific areas of neural physiology and vibro-tactile perception, mechanoreceptors in skin of a human may sense mechanical vibration and transmit signals to the brain of the human to form haptic perceptions. One of such mechanoreceptors, the Pacinian corpuscles, is sensitive to such vibrations applied to skin of a human finger. The sensitive region of Pacinian corpuscles is above 40 Hz, with peak sensitivity around 200 Hz to 300 Hz. The sensitivity of the Pacinian neuro-receptors may be characterized by a U-shaped threshold curve U(f) (an example of which is shown in FIG. 7), with its minimum around 150 Hz to 250 Hz, which frequency region corresponds to maximum haptic sensitivity of human finger skin.

At step 510, test module 408 may apply perceptual haptic sensitivity model H(f) (e.g., in order to perform haptic perceptual filtering) to main pulse $x_m(t)$, in either the time domain or the frequency domain, to obtain a haptic-perceptible component $x_m^h(t)$ of main pulse $x_m(t)$. If in the time domain, such application of perceptual haptic sensitivity model H(f) may correspond to convolutive filtering as:

$$x_m^h(t) = x_m(t) * h(t),$$

where $h(t) = F^{-1}\{H(f)\}$ is the inverse Fourier transform of the haptic sensitivity model. If in the frequency domain, such application of perceptual haptic sensitivity model H(f) may be given as:

$$x_m^h(f) = X_m(f) \cdot H(f),$$

where $X(t) = F\{x_m(t)\}$ is the Fourier transform of the main-pulse signal $x_m(t)$.

At step 512, in a similar manner to that of step 510, test module 408 may apply perceptual haptic sensitivity model H(f) to resonant tail $x_r(t)$, in either the time domain or the frequency domain, to obtain a haptic-perceptible component $x_r^h(t)$ of resonant tail $x_r(t)$. If in the time domain, such application of perceptual haptic sensitivity model H(f) may be given as:

$$x_r^h(t) = x_r(t) * h(t)$$

If in the frequency domain, such application of perceptual haptic sensitivity model H(f) may be given as:

$$X_r^h(f) = X_r(f) \cdot H(f)$$

At step 514, test module 408 may calculate a perceptual haptic-sharpness score as a perceptual pulse-to-resonance ratio or perceptual pulse-to-ringing ratio (PPRR) value from the above-obtained haptic-perceptible components of main pulse signal $x_m(t)$ and resonant tail signal $x_r(t)$, $x_m^h(t)$ and $x_r^h(t)$. The PPRR value in dB, dbPPRR, may be defined as the ratio of the perceptual energy of main pulse to that of the resonant tail:

$$S^h = dbPPRR = 20 * \log_{10}\left(\frac{RMS(x_m^h(t))}{RMS(x_r^h(t))}\right)$$

In some embodiments, at step 516, test module 408 may revise the perceptual haptic-sharpness score calculated in step 514 above for emphasis on a subjective feeling of "crispness" and obtain a perceptual haptic-crispness score (PHCS), by weighting dbPPRR with a crispness factor C:

$$s^h = C \cdot dbPPRR$$

An example of such a crispness factor C may be a crest factor of the main pulse signal $x_m(t)$:

$$C = CrestFactor\{x_m(t)\},$$

wherein, the crest factor of $x_m(t)$ may be defined as its peak-to-RMS ratio:

$$CrestFactor\{x_m(t)\} = \frac{Max\{|x_m(t)|\}}{RMS\{x_m(t)\}}$$

Another example of a crispness factor C may be given by:

$$C = \frac{\alpha}{\text{Time duration }\{x_m(t)\} + \beta}$$

where $\alpha$ and $\beta$ are constants.

While specific examples for calculation of crispness factor C are given above, there may be other forms of definition for crispness factor C, wherein such crispness factor C take into account a duration of main pulse signal $x_m(t)$ and a rate of change in main pulse signal $x_m(t)$ to provide an indication of subjective crispness of a haptic response.

The proposed perceptual sharpness score ($S^h$=dbPPRR) and the optional perceptual crispness score ($S^h$=C·dbPPRR) may thus provide a quantification of haptic signal fidelity, with more perceptual-relevant objective measures for subjective haptic sharpness and crispness evaluations of the virtual mechanical button responses generated by linear resonant actuator 107, as compared to existing approaches to measuring haptic responses.

Although FIG. 5 discloses a particular number of steps to be taken with respect to method 500, method 500 may be executed with greater or fewer steps than those depicted in FIG. 5. In addition, although FIG. 5 discloses a certain order of steps to be taken with respect to method 500, the steps comprising method 500 may be completed in any suitable order.

Method 500 may be implemented in whole or part using processor 402, test module 408, and/or any other system operable to implement method 500. In certain embodiments, method 500 may be implemented partially or fully in software and/or firmware embodied in computer-readable media.

Figure 8:
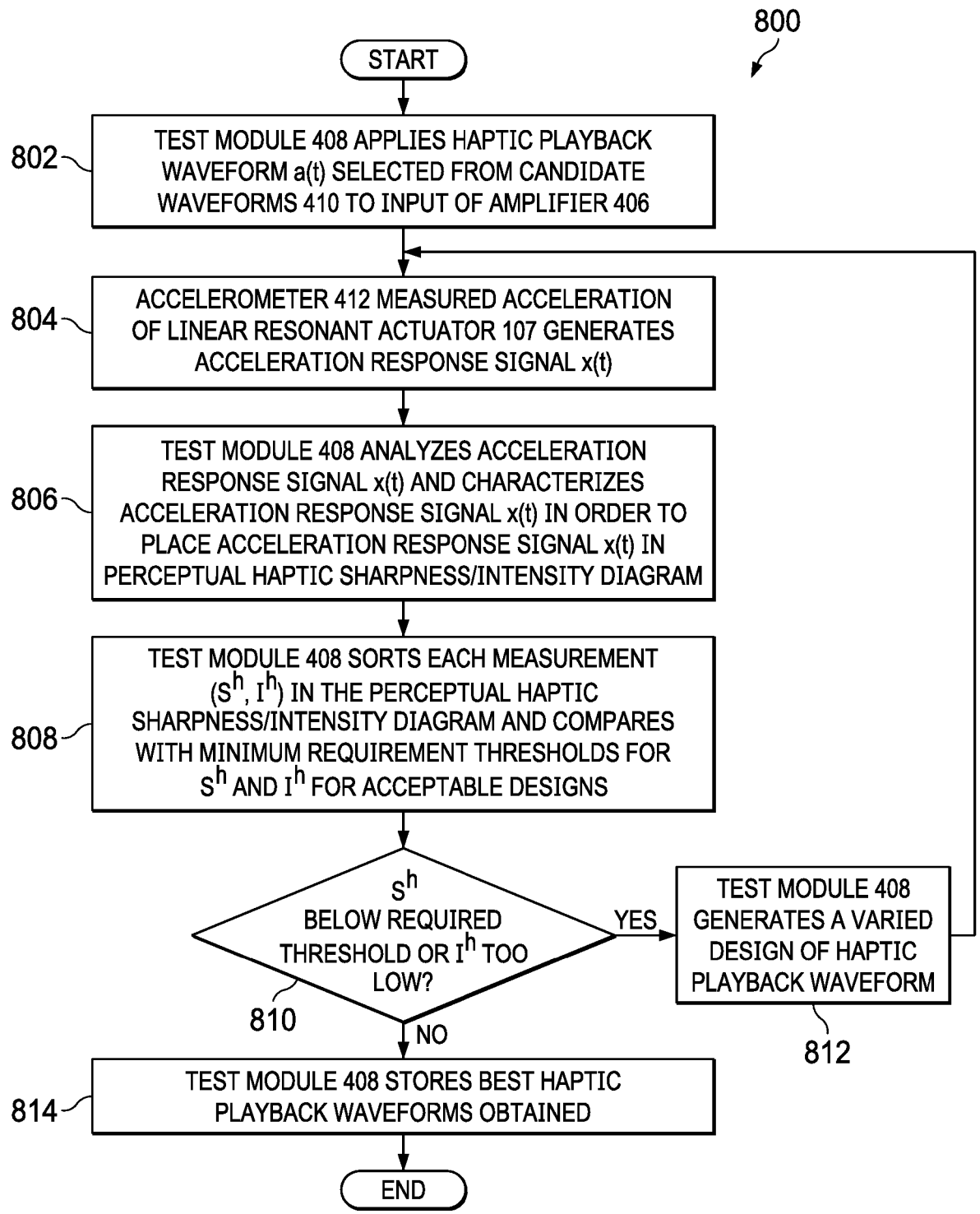
FIG. 8 illustrates a flow chart of an example method for automatic evaluation and design of haptic stimuli, in accordance with embodiments of the present disclosure.

FIG. 8 illustrates a flow chart of an example method 800 for automatic evaluation and design of haptic stimuli, in accordance with embodiments of the present disclosure. According to some embodiments, method 800 may begin at step 802. As noted above, teachings of the present disclosure may be implemented in a variety of configurations of test system 400. As such, the preferred initialization point for method 800 and the order of the steps comprising method 800 may depend on the implementation chosen.

At step 802, test module 408 may apply a haptic playback waveform a(t) selected from candidate waveforms 410 to the input of amplifier 406, which in turn may amplify haptic playback waveform a(t) to generate an amplified haptic playback waveform a'(t) (e.g., a voltage signal) at the input of linear resonant actuator 107.

At step 804, linear resonant actuator 107 may vibrate as a function of amplified haptic playback waveform a'(t), and acceleration generated by linear resonant actuator 107 may be measured by accelerometer 412, which may generate an acceleration response signal x(t) indicative of such measured acceleration.

At step 806, processor 402 may receive acceleration response signal x(t) and test module 408 may analyze acceleration response signal x(t) and characterize acceleration response signal x(t) in order to place acceleration response signal x(t) in a perceptual haptic sharpness/intensity diagram. To illustrate, in the design of actual haptic-system and haptic-stimulus waveforms, it may be desirable to generate sharp haptic perception, and it may be desirable that the perceived intensity of the haptic responses is strong. In addition, with different combinations of sharpness and intensity levels, various haptic effects may be achieved, and each one may focus on different application scenarios. Therefore, in accordance with embodiments of the present disclosure, a perceptual sharpness-intensity diagram (PSID) may be used to differentiate such variations and differences, as well as to evaluate the performance of various haptic stimulus waveforms and haptic clicking devices. Based on the perceptual sharpness-intensity diagram disclosed herein, more efficient and perceptual-relevant automatic evaluations of haptic click designs may be achieved. In addition, procedures for potential automatic haptic playback waveform designs may also be defined.

Figure 9:
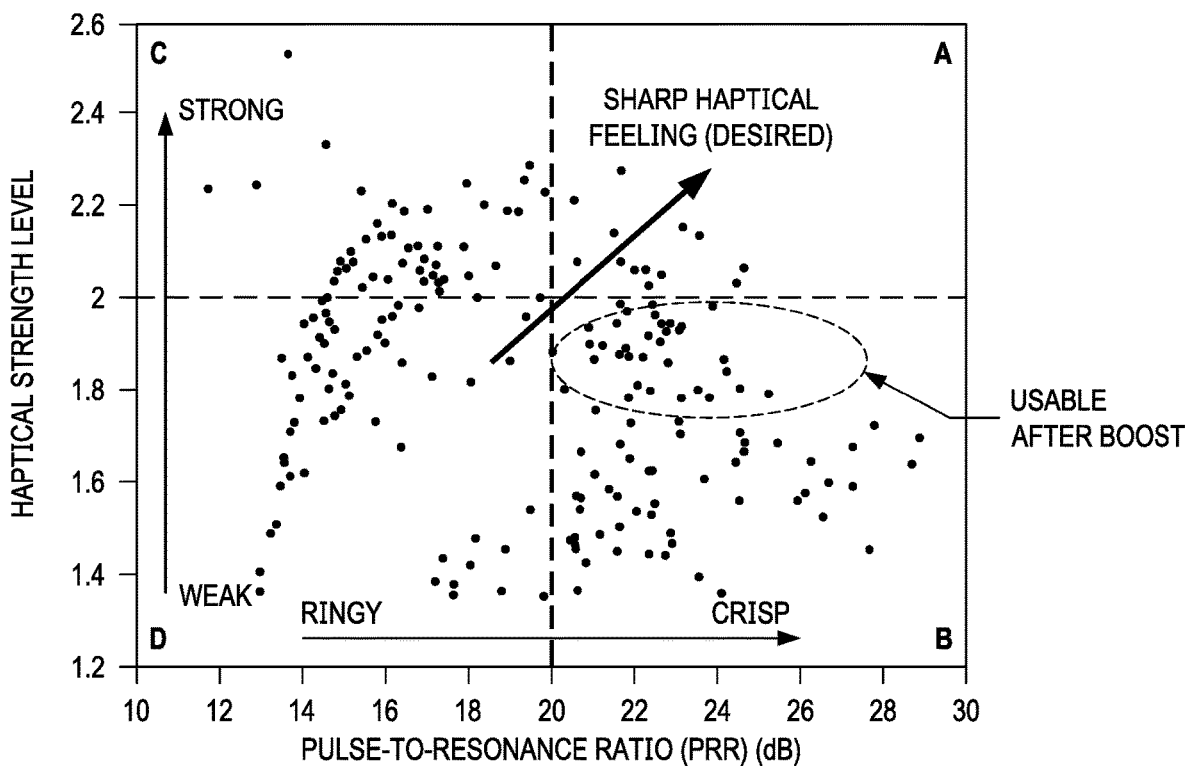
FIG. 9 illustrates an example of a haptic sharpness diagram, in accordance with embodiments of the present disclosure.

FIG. 9 illustrates an example of a haptic sharpness diagram, in accordance with embodiments of the present disclosure. A perceptual haptic sharpness/intensity diagram (PHSID) may be a two-dimensional plot that displays a joint distribution $(S^h, I^h)$ of the above-mentioned perceptual sharpness score $S^h$ and a perceptual haptic intensity (PHI) level $(I^h)$ of haptic vibrations generated by linear resonant actuator 107. The calculation of PHI level $I^h$, may also be based on the perceptual haptic sensitivity model described above. For example, as described above in relation to step 510 of method 500, a perceptual main pulse signal $x_m^h(t)$ may be obtained from the vibrational measurement. Perceptual haptic intensity $I^h$ may be defined as a strength of perceptual main pulse signal $x_m^h(t)$, and depending on different strength definitions, there may be several definitions for the perceptual haptic intensity level. For example, in some embodiments, perceptual haptic intensity $I^h$ of perceptual main pulse signal $x_m^h(t)$ may be given as the root-mean-square level of perceptual main pulse signal $x_m^h(t)$:

$$I^h = RMS\{x_m^h(t)\}$$

As another example, in other embodiments, perceptual haptic intensity $I^h$ of perceptual main pulse signal $x_m^h(t)$ may be given as the peak level of perceptual main pulse signal $x_m^h(t)$:

$$I^h = Max\{|x_m^h(t)|\}$$

When both the perceptual sharpness score $S^h$ and the perceptual haptic intensity $I^h$ are available, a location of the $(S^h, I^h)$ pair gives, in a perceptual haptic sharpness/intensity diagram, such as that shown in FIG. 9, a position of a haptic system under test in terms of haptic performances in both sharpness and intensity together. Such perceptual haptic sharpness and intensity diagram may be used to evaluate and compare vibro-haptic performances of different linear resonant actuator devices and/or evaluate and compare haptic performances of different haptic playback waveforms designed and played through a linear resonant actuator. To that end, FIG. 9 provides an example of haptic sharpness/intensity distributions of multiple haptic playback waveforms (shown as points in FIG. 9), measured from a single linear resonant actuator driven by such haptic playback waveforms.

Turning back to FIG. 8, at step 808, test module 408 may sort test results in terms of perceptual sharpness score or, optionally, perceptual crispiness score, each measurement $(S^h, I^h)$ in the perceptual haptic sharpness/intensity diagram, and compare with minimum requirement thresholds for $S^h$ and $I^h$ for acceptable designs. At step 810, if either a perceptual sharpness/crispiness score $S^h$ is below a required threshold, or a perceptual haptic intensity level $I^h$ is too low, method 800 may proceed to step 812. Otherwise, method 800 may proceed to step 814.

At step 812, test module 408 may generate a varied design of a haptic playback waveform and then method 800 may proceed again to step 804.

At step 814, test module 408 may end the design and evaluation procedure and store (e.g., in memory 204) the best haptic playback waveforms obtained (e.g., those having the highest perceptual sharpness/crispiness score $S^h$ values and acceptable intensity levels of perceptual haptic intensity level $I^h$). After completion of step 814, method 800 may end.

Although FIG. 8 discloses a particular number of steps to be taken with respect to method 800, method 800 may be executed with greater or fewer steps than those depicted in FIG. 8. In addition, although FIG. 8 discloses a certain order of steps to be taken with respect to method 800, the steps comprising method 800 may be completed in any suitable order.

Method 800 may be implemented in whole or part using processor 402, test module 408, and/or any other system operable to implement method 800. In certain embodiments, method 800 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for quantifying fidelity of a haptic signal, comprising:
   receiving a response signal indicative of a vibrational response of a vibrational transducer to a haptic playback waveform driven to the vibrational transducer;
   perceptually filtering the response signal to obtain human haptic-perceptible components of the response signal; and
   quantifying fidelity of the haptic playback waveform based on at least one quantitative characteristic of the human haptic-perceptible components of the response signal.

2. The method of claim 1, further comprising sensing the response signal from a vibrational sensor, wherein receiving the response signal comprises receiving the response signal from the vibrational sensor.

3. The method of claim 2, wherein the vibrational sensor comprises an accelerometer.

4. The method of claim 1, wherein the vibrational transducer comprises a linear resonant actuator.

5. The method of claim 1, wherein the at least one quantitative characteristic comprises a perceived haptic sharpness measure quantifying a human haptic-perceptible sharpness of the response signal.

6. The method of claim 5, wherein the perceived haptic sharpness measure comprises a human haptic-perceptible pulse-to-ringing ratio value defined by a ratio of a perceptual energy of a main pulse component of the response signal as perceptually filtered to a perceptual energy of a resonant tail component of the response signal as perceptually filtered.

7. The method of claim 6, wherein:
   the main pulse component comprises a first portion of the response signal as perceptually filtered from a beginning of the response signal to a time at which energy of the response signal as perceptually filtered has decayed to a predetermined percentage of its peak energy; and
   the resonant tail component comprises a second portion of the response signal occurring after the time at which energy of the response signal as perceptually filtered has decayed to the predetermined percentage of its peak energy.

8. The method of claim 6, wherein the at least one quantitative characteristic comprises a perceived haptic crispness derived by weighting the perceived haptic sharpness measure with a crispness factor based indicative of a subjective crispness of the main pulse component of the response signal.

9. The method of claim 8, wherein the crispness factor is based on a crest factor of the main pulse component of the response signal.

10. The method of claim 8, wherein the crispness factor is based on a time duration of the main pulse component of the response signal.

11. The method of claim 5, wherein the at least one quantitative characteristic comprises a perceived haptic crispness derived by weighting the perceived haptic sharpness measure with a crispness factor indicative of subjective crispness of the response signal.

12. The method of claim 1, wherein perceptual filtering comprises filtering with a perceptual filter having a filter response representative of human tactile sensitivity as a function of frequency.

13. The method of claim 12, wherein the filter response comprises an inverse response of a perceptual threshold model of human haptic receptors.

14. The method of claim 1, further comprising:
   automatically evaluating the response signal based on at least one quantitative characteristic; and
   automatically generating another haptic playback waveform for evaluation based on the evaluating.

15. A system for quantifying fidelity of a haptic signal, comprising:
   an input configured to receive a response signal indicative of a vibrational response of a vibrational transducer to a haptic playback waveform driven to the vibrational transducer; and
   a processor configured to:
      perceptually filter the response signal to obtain human haptic-perceptible components of the response signal; and
      quantify fidelity of the haptic playback waveform based on at least one quantitative characteristic of the human haptic-perceptible components of the response signal.

16. The system of claim 15, further comprising sensing the response signal from a vibrational sensor, wherein receiving the response signal comprises receiving the response signal from the vibrational sensor.

17. The system of claim 16, wherein the vibrational sensor comprises an accelerometer.

18. The system of claim 15, wherein the vibrational transducer comprises a linear resonant actuator.

19. The system of claim 15, wherein the at least one quantitative characteristic comprises a perceived haptic sharpness measure quantifying a human haptic-perceptible sharpness of the response signal.

20. The system of claim 19, wherein the perceived haptic sharpness measure comprises a human haptic-perceptible pulse-to-ringing ratio value defined by a ratio of a perceptual energy of a main pulse component of the response signal as perceptually filtered to a perceptual energy of a resonant tail component of the response signal as perceptually filtered.

21. The system of claim 20, wherein:
   the main pulse component comprises a first portion of the response signal as perceptually filtered from a beginning of the response signal to a time at which energy of the response signal as perceptually filtered has decayed to a predetermined percentage of its peak energy; and
   the resonant tail component comprises a second portion of the response signal occurring after the time at which energy of the response signal as perceptually filtered has decayed to the predetermined percentage of its peak energy.

22. The system of claim 20, wherein the at least one quantitative characteristic comprises a perceived haptic crispness derived by weighting the perceived haptic sharpness measure with a crispness factor based indicative of a subjective crispness of the main pulse component of the response signal.

23. The system of claim 22, wherein the crispness factor is based on a crest factor of the main pulse component of the response signal.

24. The system of claim 22, wherein the crispness factor is based on a time duration of the main pulse component of the response signal.

25. The system of claim 19, wherein the at least one quantitative characteristic comprises a perceived haptic crispness derived by weighting the perceived haptic sharpness measure with a crispness factor indicative of subjective crispness of the response signal.

26. The system of claim 15, wherein perceptual filtering comprises filtering with a perceptual filter having a filter response representative of human tactile sensitivity as a function of frequency.

27. The system of claim 26, wherein the filter response comprises an inverse response of a perceptual threshold model of human haptic receptors.

28. The system of claim 15, further comprising:
automatically evaluating the response signal based on at least one quantitative characteristic; and
automatically generating another haptic playback waveform for evaluation based on the evaluating.

\* \* \* \* \*